(12) United States Patent
Mulligan et al.

(10) Patent No.: US 7,388,147 B2
(45) Date of Patent: Jun. 17, 2008

(54) METAL CONTACT STRUCTURE FOR SOLAR CELL AND METHOD OF MANUFACTURE

(75) Inventors: William P. Mulligan, San Jose, CA (US); Michael J. Cudzinovic, Sunnyvale, CA (US); Thomas Pass, San Jose, CA (US); David Smith, San Jose, CA (US); Richard M. Swanson, Los Altos, CA (US)

(73) Assignee: Sunpower Corporation, San Jose, CA (US)

(*) Notice: Subject to any disclaimer, the term of this patent is extended or adjusted under 35 U.S.C. 154(b) by 709 days.

(21) Appl. No.: 10/412,711

(22) Filed: Apr. 10, 2003

(65) Prior Publication Data

US 2004/0200520 A1  Oct. 14, 2004

(51) Int. Cl.
*H01L 31/00* (2006.01)
(52) U.S. Cl. .................. 136/256; 136/261; 438/98; 205/123; 205/157
(58) Field of Classification Search ........ 136/243–265; 205/118–136, 157; 438/83, 98
See application file for complete search history.

(56) References Cited

U.S. PATENT DOCUMENTS

| | | | |
|---|---|---|---|
| 4,234,352 A | 11/1980 | Swanson | |
| 4,478,879 A | 10/1984 | Baraona et al. | |
| 4,557,037 A | 12/1985 | Hanoka et al. | 29/576 B |
| 4,920,639 A * | 5/1990 | Yee | 29/846 |
| 4,927,770 A | 5/1990 | Swanson | |
| 5,053,083 A | 10/1991 | Sinton | |
| 5,151,168 A * | 9/1992 | Gilton et al. | 205/123 |
| 5,310,699 A | 5/1994 | Chikawa et al. | 437/183 |
| 6,551,931 B1 * | 4/2003 | Edelstein et al. | 438/687 |
| 6,638,688 B2 * | 10/2003 | Ching et al. | 430/311 |
| 2003/0160026 A1 * | 8/2003 | Klein et al. | 216/83 |

FOREIGN PATENT DOCUMENTS

| | | |
|---|---|---|
| GB | 2095904 A | 10/1982 |
| WO | WO82/01102 | 4/1982 |
| WO | WO 01/83391 A1 * | 11/2001 |

OTHER PUBLICATIONS

J.S. You et al, "A Study on Cu Metallization for Crystalline Si Solar Cells", Conf. Rec. 29th IEEE PV Spec. Conf., p. 277-280. (May 19-24, 2002).*

(Continued)

*Primary Examiner*—Nam X Nguyen
*Assistant Examiner*—Jeffrey T Barton
(74) *Attorney, Agent, or Firm*—Okamoto & Benedicto LLP

(57) ABSTRACT

In a solar cell having p doped regions and n doped regions alternately formed in a surface of a semiconductor wafer in offset levels through use of masking and etching techniques, metal contacts are made to the p regions and n regions by first forming a base layer contacting the p doped regions and n doped regions which functions as an antireflection layer, and then forming a barrier layer, such as titanium tungsten or chromium, and a conductive layer such as copper over the barrier layer. Preferably the conductive layer is a plating layer and the thickness thereof can be increased by plating.

10 Claims, 3 Drawing Sheets

OTHER PUBLICATIONS

Sinton et al., "27.5-Percent Silicon Concentrator Solar Cells," IEEE Electronic Device Letters, vol. EDL-7, No. 10, Oct. 1986, pp. 567-569.

Verlinden et al., "High Efficiency Interdigitated Back Contact Silicon Solar Cells," Proc. 19th IEEE Photovolt. Solar Energy Conf., New Orleans, LA, May 1987, pp. 405-410.

Sinton et al., "Simplified Backside-Contact Solar Cells," IEEE Transactions on Electron Devices, vol. 37, No. 2, Feb. 1990, pp. 348-352.

Gee et al., "Emitter Wrap-Through Solar Cell," 23rd IEEE Photo. Spec. Conf., 1993, pp. 265-270.

Verlinden et al., "High Efficiency Silicon Point-Contact Solar Cells for Concentrator and High Value One-Sun Applications," 12th European Photovoltiac Solar Energy Conference, Amsterdam, The Netherlands, Apr. 11-15, 1994, pp. 1477-1480.

Gee et al., "Progress on the Emitter Wrap-Through Silicon Solar Cell," 12th European Photovoltaic Solar Energy Conference, Amsterdam, The Netherlands, Apr. 11-15, 1994, pp. 743-746.

Schönecker et al., "An Industrial Multi-Crystalline EWT Solar Cell with Screen Printed Metallisation," 14th European Photovoltiac Solar Energy Conference, Barcelona, Spain, Jun. 30-Jul. 4, 1997, pp. 796-799.

Meier et al., "Self-Doping Contacts and Associated Silicon Solar Cell Structures," 2nd World Conference and Exhibition on Photovoltiac Solar Energy Conversion, Vienna, Austria, Jul. 6-10, 1998, pp. 1491-1494.

Faika et al., "Simplification of EWT (Emitter Wrap-Through) Solar Cell Fabrication Using AL-P-Codiffusion," Proc. 28th IEEE Photovoltaic Specialists Conf., 2000, pp. 260-263.

Van Kerschaver et al., "Towards Back Contact Silicon Solar Cells with Screen Printed Metallisation," Proc. 28th IEEE Photovoltaic Specialists Conf., 2000, pp. 209-212.

Kress et al., "10×10 $cm^2$ Screen Printed Back Contact Cell with a Selective Emitter," Proc. 28th IEEE Photovoltiac Specialists Conf., 2000, pp. 213-216.

International Search Report and Written Opinion from Corresponding PCT Application PCT/US2004/006729, mailed Oct. 22, 2004.

U.S. Appl. No. 10/412,638, filed Apr. 10, 2003.

* cited by examiner

METAL CONTACT STRUCTURE FOR SOLAR CELL AND METHOD OF MANUFACTURE

BACKGROUND OF THE INVENTION

This invention relates generally to solar cells, and more particularly the invention relates to metal contact structures for use in solar cells.

The use of photovoltaic cells for the direct conversion of solar radiation into electrical energy is well known, see Swanson, U.S. Pat. No. 4,234,352 for example. Briefly, the photovoltaic cell comprises a substrate of semiconductive material having a p-n junction defined therein. In the planar silicon cell the p-n junction is formed near a surface of the substrate which receives impinging radiation. Radiated photons create mobile carriers (holes and electrons) and the substrate which can be directed to an electrical circuit outside of the cell. Only photons having at least a minimum energy level (e.g., 1.1 electron volt for silicon) can generate an electron-hole pair in the semiconductor pair. Photons having less energy are either not absorbed or are absorbed as heat, and the excess energy of photons having more than 1.1 electron volt energy (e.g., photons have a wavelength of 1.1 µm and less) create heat. These and other losses limit the efficiency of photovoltaic cells in directly converting solar energy to electricity to less than 30%.

Solar cells with interdigitated contacts of opposite polarity on the back surface of the cell are known and have numerous advantages over conventional solar cells with front side metal grids and blanket or grid metallized backside contacts, including improved photo-generation due to elimination of front grid shading, much reduced grid series resistance, and improved "blue" photo-response since heavy front surface doping is not required to minimize front contact resistance and since there are no front contacts. In addition to the performance advantages, the back/contact cell structure allows simplified module assembly due to coplanar contacts. See Swanson U.S. Pat. No. 4,927,770 for example.

The present invention is directed to an improved metal contact structure which is especially applicable to solar cells.

BRIEF SUMMARY OF THE INVENTION

In accordance with the invention, a solar cell has a metal contact structure including a first metal layer in contact with the semiconductor substrate which can also function as an infrared reflector. A diffusion barrier metal layer covers the first metal layer and provides a base for plating additional metal.

In a preferred embodiment, a silicon cell having a first major surface for receiving solar radiation has an opposing or backside surface in which p-doped and n-doped regions are formed in a spaced parallel arrangement. Interdigitated metal contacts and grid lines respectively contact the p and n doped regions.

In forming the interdigitated metal contacts to the p and n regions, arrays of small contact openings are fabricated in the silicon oxide layer by using a patterned etch resist and chemical etching. A seed layer metal stack is then sputtered on the back side of the cell. The first metal in the stack provides ohmic contact to the silicon through the contact openings in the oxide and acts as an infrared reflector. A second metal layer acts as a diffusion barrier and adhesion layer. A top metal layer then forms a base to initiate plating. A patterned plating resist is then applied over the seed layer, and metal is plated on the cell to build up thickness for the metal grid lines. Finally, the plating resist is stripped, and the metal layer between the grid lines is removed by chemical etching.

The invention and objects and features thereof will be more readily apparent from the following detailed description and appended claims when taken with the drawings.

DETAILED DESCRIPTION OF THE INVENTION

Figure 1:
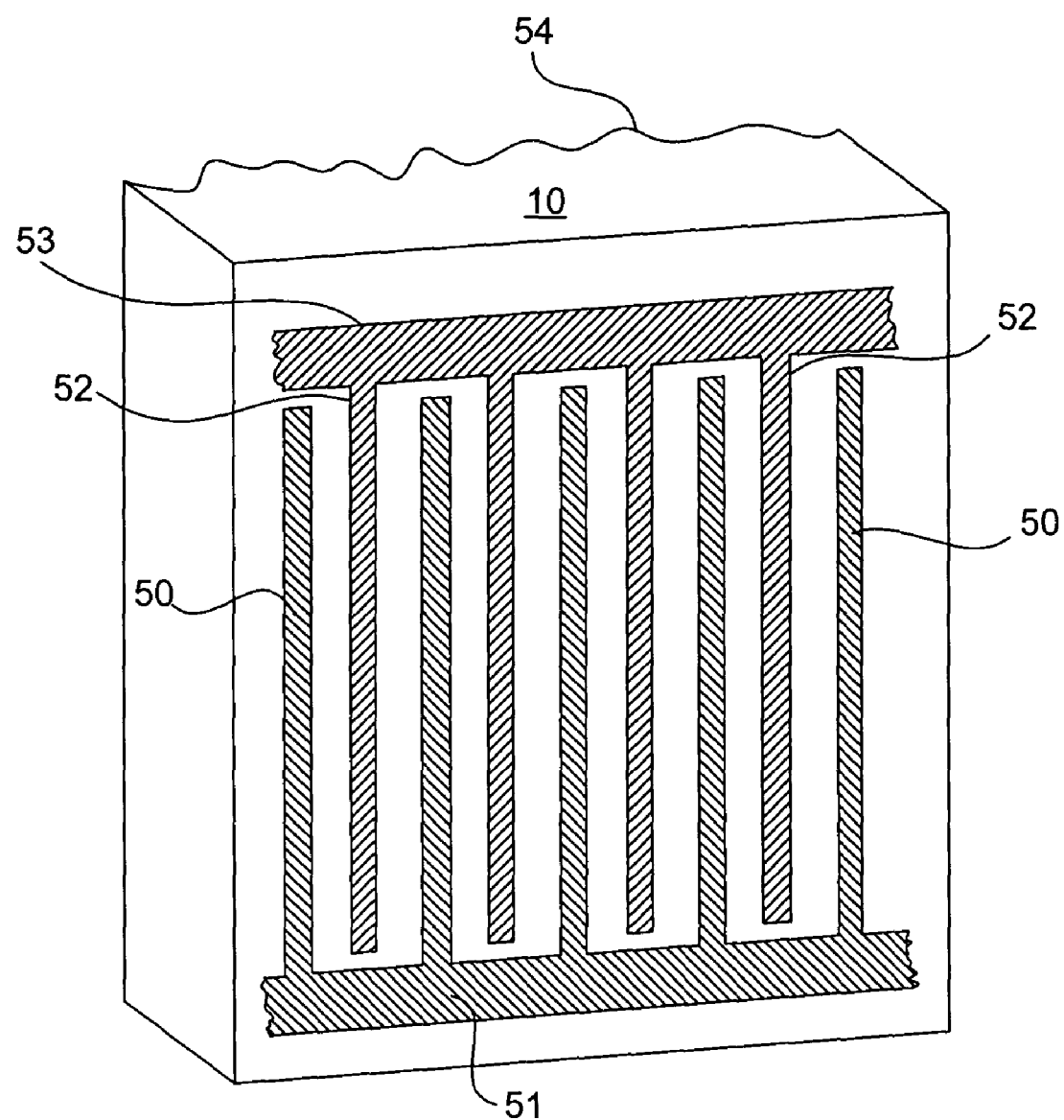
FIG. 1 is a perspective view illustrating the back side of a finished solar cell with metal contacts fabricated in accordance with one embodiment of the invention.

FIG. 1 is a perspective view of a solar cell in which metal contacts in accordance with the invention are especially applicable. In this embodiment, the cell is preferably manufactured in a single crystalline silicon substrate having a (100) crystalline orientation or in a multi-crystalline silicon substrate with minority carrier lifetime greater than 200 micro-seconds.

In this embodiment, a front surface of the solar cell has a textured surface 54. An antireflection coating can be applied to assist in the coupling of light energy into the solar cell and improve efficiency. On a back surface, metal contacts 50, 52 in accordance with the invention contact p doped regions and n doped regions respectively, in spaced layers of the back surface. The contacts are respectively connected with grid lines 51, 53 in a grid pattern. The line size is exaggerated in the drawing. The fabrication of the solar cell uses conventional semiconductor processing, including the use of backside diffusions, and the texturing of the front surface. Since these process steps form no part of the present invention, further description of the semiconductor processing is not provided.

Consider now the metal contacts 50, 52 and fabrication thereof in accordance with the invention. A preferred embodiment will be described with reference to the side views in section of wafer 10 shown in FIGS. 2-8.

Figure 2:
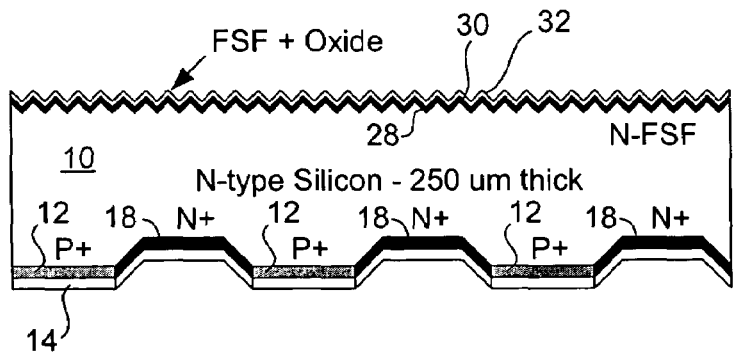
FIGS. 2-8 are side views in section illustrating steps in fabricating a metal contact structure for a solar cell in accordance with one embodiment of the invention.

In FIG. 2, wafer 10 has the textured front surface including a doped layer 28, a silicon oxide layer 30, and an antireflection coating (ARC) 32 such as SiN or $TiO_2$ made from earlier processing steps. The back surface has p+ regions 12 and n+ regions 18 in spaced levels with an overlying silicon oxide layer 14. The p+ and n+ regions can be made in accordance with the teachings of Sinton U.S. Pat. No. 5,053,083.

Figure 3:
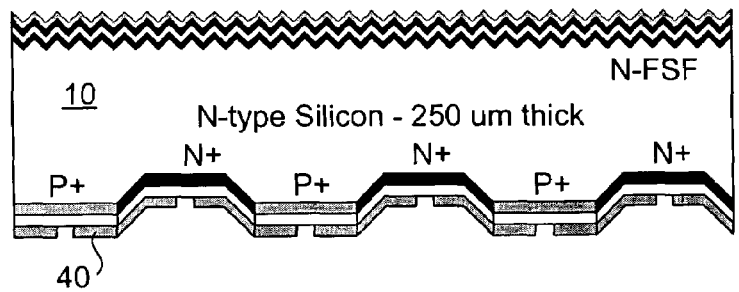
Figure 4:
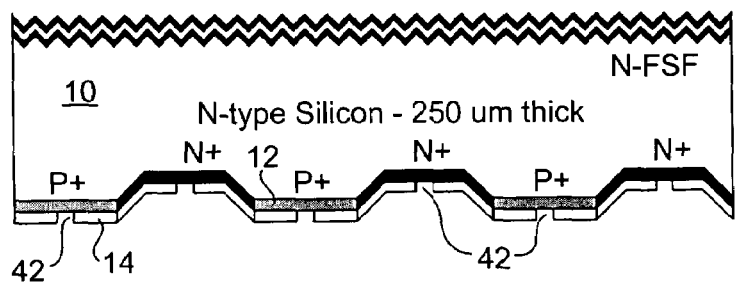

As shown in FIG. 3, a patterned etch resist 40 is applied over the back side silicon oxide 14. Resist 40 is then either thermal or UV cured. Depending on the ARC material, a patterned etch resist may be applied over the front of the solar cell to protect the ARC from subsequent etching. In FIG. 4, arrays of small contact openings 42 are chemically etched in the silicon oxide over both the p and n regions 12, 18, then the etch resist 40 is stripped using a caustic solution. The total contact area as a fraction of the entire back side is typically less than 5%. Reducing the metal to semiconductor contact area greatly reduces photo-generated carrier recombination at the back surface of the solar cell, and hence increases cell efficiency.

Alternatively, the contact mask and contact oxide etch can be eliminated from the process and contact openings can be formed in the oxide layer by other methods, such as laser ablation of oxide, or direct printing of chemical pastes that etch the oxide.

Figure 5:
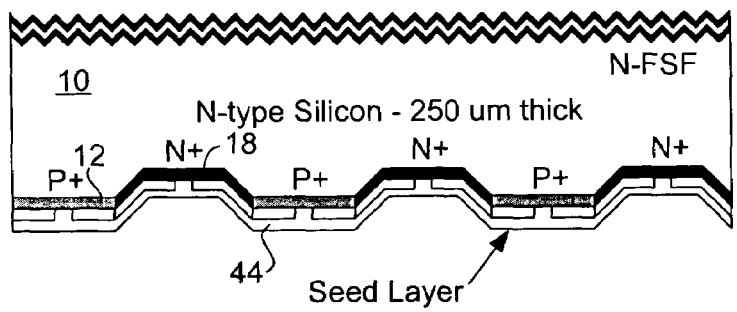

In FIG. 5, a thin (approximately 400 nm) 3-layer seed metal stack 44 is sputtered or evaporated onto the solar cell for contacts to p+ region 12 and n+ region 18. The first layer of the stack, aluminum in the preferred embodiment, makes ohmic contact to the semiconductor material and acts as a back surface reflector. In thin silicon solar cells, weakly absorbed infrared radiation passes through the thickness of silicon and is often lost by absorption in backside metallization. In one embodiment, the seed layer covers mostly silicon oxide, except in small contact openings where it contacts the silicon. The metallized silicon oxide stack is designed to be an excellent infrared reflector, reflecting light back into the cell and effectively multiplying the absorption path length. The front surface texture in combination with the back surface reflector can increase the optical path length to more than twenty times the wafer thickness. This design feature leads to higher photo-generated current in the solar cell.

A second layer, titanium-10%/tungsten-90% (TiW) in the preferred embodiment acts as a diffusion barrier to metals and other impurities. A third layer, copper (Cu) in the preferred embodiment, is used to provide a base or strike layer for initiating electroplating of metal. Alternatively, chromium (Cr) or nickel can be used as the barrier layer instead of TiW. Because the seed layer, a Al(Si)/TiW/Cu stack in the preferred embodiment, is not required to have significant current-carrying capacity, it can be made very thin. Hence the manufacturing cost of depositing the seed layer is low. The metal layer comprises a Al(Si)/TiW/Cu stack, where the aluminum provides ohmic contact and back surface reflectance, TiW acts as the barrier layer, and Cu acts as the plating base. Alternatively, chromium (Cr) can be used as the barrier layer instead of TiW. The metal semiconductor contact can be annealed in a forming gas atmosphere, preferably at 400° C. Alternatively, the contact anneal step can be eliminated.

Figure 6:
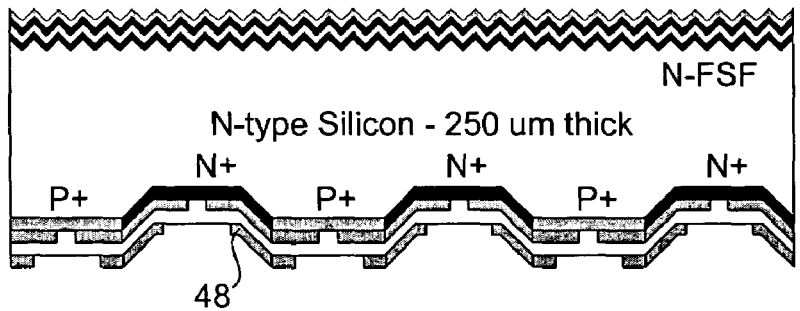

Next, as shown in FIG. 6, a patterned plating resist 48 is applied to the seed layer. In the preferred embodiment, the plating resist is directly patterned on the wafer. After application, the plating resist is cured to harden it against the subsequent electroplating solution. Metal does not plate in areas covered by the plating resist. Alternatively, the barrier layer can be selectively patterned and etched before plating to limit plating area.

Figure 7:
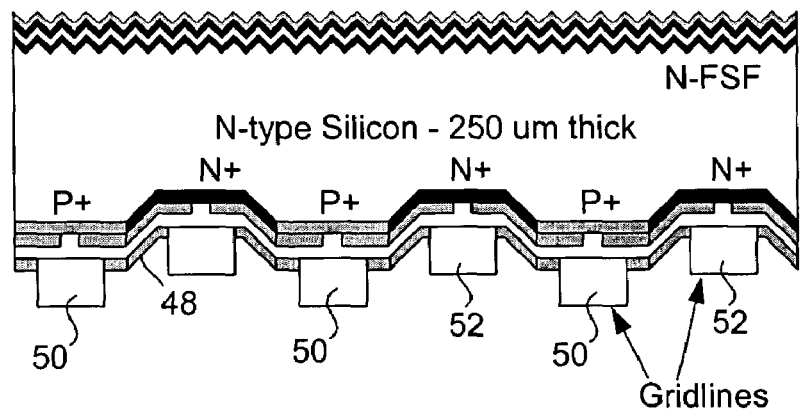

In FIG. 7, the thickness of the metal layer in regions without plating resist is greatly increased by electroplating or electroless plating a good electrical conductor to act as low series resistance metal grid lines 50, 52. In the preferred embodiment, about 20 μm of copper are electroplated. A thin capping layer, such as tin or silver or nickel, may be plated after the copper to improve solderability and/or to prevent etching of plated areas during etch back. Preferably about 7 μm of tin are electroplated.

Figure 8:
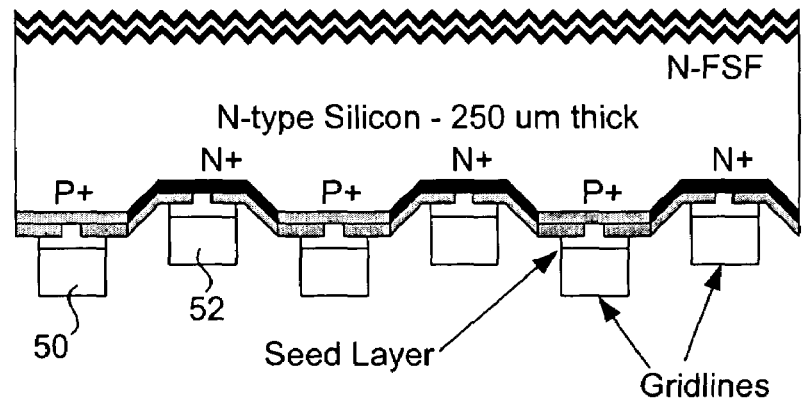

Finally, as shown in FIG. 8, plating resist 48 is stripped and the metal film is etched to remove the thin seed layer 44 between the plated conductive lines. The etch back chemistries are chosen such that they selectively etch the seed metal stack components over the plated metal capping layer. Alternatively, a small amount of metal on the plated conductive lines may be sacrificed during etchback if a capping layer is not used, or if it is not selective to the etchback chemistries.

The final structure is shown in perspective view in FIG. 1 showing the interdigitated metal contacts 50, 52 to the p+ regions and n+ regions, respectively, of the solar cell.

The stacked metal contacts in accordance with the invention provide good ohmic connection and reflection properties on the back side of a solar cell. A number of alternative processing steps and structural elements have been suggested for the preferred embodiment. Thus while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claim is:

1. A method of fabricating a solar cell, the method comprising:
    providing a wafer having a front side enabling entry of light into the wafer and a back side opposite the front side;
    forming a silicon oxide layer on a surface on the back side of the wafer such that a plurality of openings in the silicon oxide layer expose doped regions of the solar cell;
    forming a metallized seed layer on the silicon oxide layer wherein the metallized seed layer also extends through the openings to contact the doped regions,
    the metallized seed layer including an infrared reflecting layer comprising aluminum and operating as an infrared reflector, wherein said metallized seed layer includes a plating seed layer, and wherein the metallized seed layer includes a diffusion barrier layer over the infrared relecting layer, the plating seed layer being over the diffusion barrier layer;
    forming a plating mask over the plating seed layer;
    plating an electrically conductive layer over the plating seed layer;
    removing the plating mask: and
    selectively etching the metallized seed layer that was under the plating mask.

2. The method as defined by claim 1, wherein the diffusion barrier layer comprises titanium tungsten.

3. The method as defined by claim 2, wherein the plating seed layer comprises copper.

4. The method as defined by claim 1 wherein forming the silicon oxide layer includes etching holes through the silicon oxide layer to permit the metallized seed layer to contact the doped regions.

5. The method as defined by claim 1 wherein forming the plating mask over the plating seed layer includes defining contacts and a grid pattern.

6. The method as defined by claim 1, and further including, after plating the electrically conductive layer over the plating seed layer applying a cap layer over the electrically conductive layer, thereby protecting the electrically conductive layer from an etchant during the etching of the seed metal layer under the plating mask.

7. The method as defined by claim 6 wherein the cap layer comprises plated tin.

8. The method as defined by claim 6 wherein the cap layer comprises an electroless plated metal.

9. The method as defined by claim 4 wherein forming the silicon oxide layer includes applying a chemical paste on the silicon oxide layer where holes through the silicon oxide are to be etched.

10. The method as defined by claim 9 wherein the chemical paste is applied by printing.

* * * * *